(12) United States Patent
Sakamoto et al.

(10) Patent No.: US 8,940,601 B2
(45) Date of Patent: Jan. 27, 2015

(54) MANUFACTURING METHOD OF SEMICONDUCTOR DEVICE

(75) Inventors: Misato Sakamoto, Kanagawa (JP);
Youichi Yamamoto, Kanagawa (JP);
Masayuki Tachikawa, Kanagawa (JP);
Yoshitake Kato, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/543,750

(22) Filed: Jul. 6, 2012

(65) Prior Publication Data

US 2013/0011994 A1    Jan. 10, 2013

(30) Foreign Application Priority Data

Jul. 7, 2011    (JP) .................. 2011-150875

(51) Int. Cl.
*H01L 21/8242* (2006.01)
*H01L 49/02* (2006.01)

(52) U.S. Cl.
CPC .............. *H01L 28/91* (2013.01); *H01L 28/40* (2013.01); *H01L 28/60* (2013.01)
USPC ........... 438/240; 438/253; 438/396; 438/660; 438/668; 438/785; 257/E21.02; 257/E21.021; 257/E21.168; 257/E21.646

(58) Field of Classification Search
USPC ................ 438/240, 253, 396, 660, 668, 785; 257/304, 532, E21.02, E21.021, 257/E21.168, E21.64, E21.646
See application file for complete search history.

(56) References Cited

U.S. PATENT DOCUMENTS

| | | | |
|---|---|---|---|
| 4,839,245 A | 6/1989 | Sue et al. | |
| 4,895,765 A | 1/1990 | Sue et al. | |
| 5,920,122 A | 7/1999 | Matsumoto et al. | |
| 5,965,942 A | 10/1999 | Itoh et al. | |
| 6,300,215 B1 | 10/2001 | Shin | |
| 6,433,380 B2 | 8/2002 | Shin | |
| 6,447,838 B1 * | 9/2002 | Azuma et al. | 427/80 |
| 6,797,561 B2 * | 9/2004 | Ko et al. | 438/240 |
| 6,995,071 B2 * | 2/2006 | Oh et al. | 438/396 |
| 7,524,774 B2 | 4/2009 | Sasaki et al. | |
| 7,560,392 B2 | 7/2009 | Krishnan et al. | |
| 7,728,376 B2 | 6/2010 | Matsui et al. | |
| 7,834,419 B2 | 11/2010 | Ohtsuka et al. | |

(Continued)

FOREIGN PATENT DOCUMENTS

| | | |
|---|---|---|
| JP | 08-170168 A | 7/1996 |
| JP | 2002-373945 | 12/2002 |

(Continued)

OTHER PUBLICATIONS

Office Action issued Oct. 14, 2014, in Japanese Patent Application No. 2011-150875.

*Primary Examiner* — Zandra Smith
*Assistant Examiner* — Toniae Thomas
(74) *Attorney, Agent, or Firm* — Miles & Stockbridge P.C.

(57) ABSTRACT

A manufacturing method of a semiconductor device includes the following steps. Firstly, a lower electrode is formed over a substrate (semiconductor substrate). Successively, the lower electrode is primarily crystallized. Successively, a capacitance dielectric layer is formed over the lower electrode after primarily crystallized. Successively, the capacitance dielectric layer is secondarily crystallized. Then, an upper electrode is formed over the capacitance dielectric layer.

7 Claims, 7 Drawing Sheets

(56) References Cited

U.S. PATENT DOCUMENTS

| | | |
|---|---|---|
| 2002/0190294 A1 | 12/2002 | Iizuka et al. |
| 2002/0197793 A1 | 12/2002 | Dornfest et al. |
| 2004/0145855 A1 | 7/2004 | Block et al. |
| 2004/0248361 A1* | 12/2004 | Oh et al. ............... 438/240 |
| 2005/0104112 A1 | 5/2005 | Haukka et al. |
| 2006/0124983 A1 | 6/2006 | Kutsunai et al. |
| 2006/0166446 A1* | 7/2006 | Sasaki et al. ........... 438/287 |
| 2007/0045856 A1 | 3/2007 | Vaartstra et al. |
| 2007/0131997 A1* | 6/2007 | Ohtsuka et al. ......... 257/301 |
| 2008/0188055 A1* | 8/2008 | Wang et al. ............ 438/386 |
| 2011/0018100 A1* | 1/2011 | Nakagawa et al. ...... 257/532 |
| 2011/0169132 A1* | 7/2011 | Yamamoto et al. ...... 257/532 |

FOREIGN PATENT DOCUMENTS

| | | |
|---|---|---|
| JP | 2003-519913 | 6/2003 |
| JP | 2004-047633 A | 2/2004 |
| JP | 2005-243921 A | 9/2005 |
| JP | 2006-270123 A | 10/2006 |
| JP | 2007-005696 | 1/2007 |
| JP | 2007-158222 A | 6/2007 |
| JP | 2007-266474 A | 10/2007 |
| JP | 2007-329286 A | 12/2007 |
| JP | 2007-329496 A | 12/2007 |
| JP | 2009-536791 A | 10/2009 |
| KR | 2001-092166 A * | 10/2001 |
| WO | 2004/008518 | 1/2004 |

* cited by examiner

MANUFACTURING METHOD OF SEMICONDUCTOR DEVICE

CROSS-REFERENCE TO RELATED APPLICATIONS

The disclosure of Japanese Patent Application No. 2011-150875 filed on Jul. 7, 2011 including the specification, drawings and abstract is incorporated herein by reference in its entirety.

BACKGROUND

The present invention relates to a manufacturing method of a semiconductor device.

In recent years, the miniaturization of a semiconductor device advances. In this situation, an MIM (Metal Insulator Metal) capacitor is required to retain a high capacitance even when it is thinned.

For example, Patent Literature 1 describes that a capacitance dielectric layer is formed over a lower electrode by an ALD (Atomic Layer Deposition) method and successively heat treatment is applied to the capacitance dielectric layer under a temperature condition of the ALD or more in a non-oxidizing atmosphere. It describes that the heat treatment temperature is 300° C. to 700° C. Further, $ZrO_2$, $HfO_2$, or $Zr_xHf_{1-x}O_2$ is used as a material for the capacitance dielectric layer. In this way, it describes that the reduction of a leak current and the increase of a capacitance value can be materialized by adding heat treatment to a specific capacitance dielectric layer material.

Then Patent Literature 2 describes that a capacitance dielectric layer of a high relative permittivity can be obtained by appropriately selecting a material having a relative permittivity of 40 or more without adding tempering at a temperature exceeding 300° C. or another process after the capacitance dielectric layer is formed.

PREVIOUS TECHNICAL LITERATURE

Patent Literature

[Patent Literature 1]
Japanese Unexamined patent Publication No. 2006-270123
[Patent Literature 2]
Japanese Unexamined patent Publication No. 2009-536791

SUMMARY

As a result of the studies by the present inventors however, it has been found that there is room for improvement in crystallization of such a capacitance dielectric layer.

The present invention makes it possible to provide a manufacturing method of a semiconductor device including the steps of forming a lower electrode over a substrate, primarily crystallizing the lower electrode, forming a capacitance dielectric layer over the lower electrode after the primary crystallization treatment, secondarily crystallizing the capacitance dielectric layer, and forming an upper electrode over the capacitance dielectric layer.

In the present invention, a capacitance dielectric layer is formed over a lower electrode after primary crystallization treatment and also the capacitance dielectric layer is subjected to secondary crystallization treatment. Consequently, it comes to be possible to sufficiently crystallize a capacitance dielectric layer in comparison with the case of applying either primary crystallization treatment or secondary crystallization treatment. As a result, it is possible to increase the relative permittivity of the capacitance dielectric layer and materialize a capacitor of a sufficient capacitance.

The present invention makes it possible to provide a semiconductor device having a sufficient capacitor capacitance.

DETAILED DESCRIPTION

Embodiments according to the present invention are hereunder explained in reference to drawings. Here, in all the drawings, an identical component is represented by an identical code and the explanations are appropriately omitted.

Figure 1:
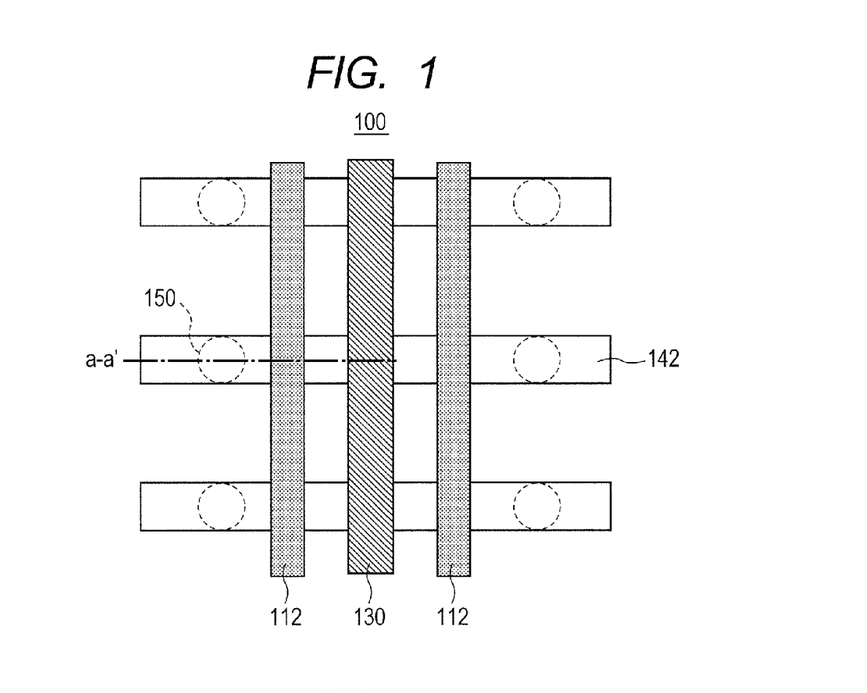
FIG. 1 is a plan view showing the configuration of a semiconductor device according to the present embodiment.
Figure 2:
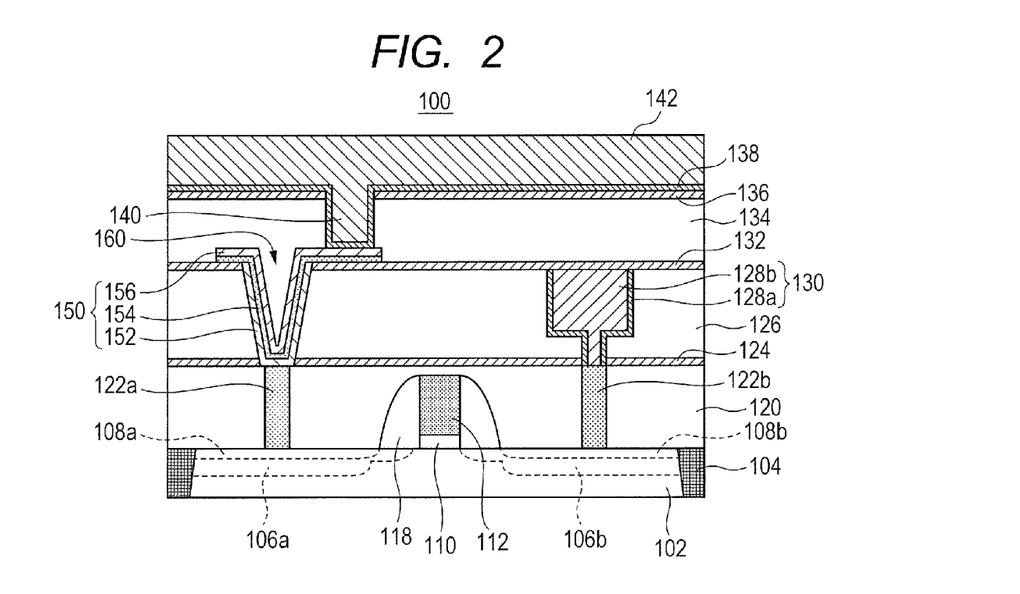
FIG. 2 is a sectional view taken on line a-a' in FIG. 1.

FIG. 1 is a plan view showing the configuration of a semiconductor device according to the present embodiment. FIG. 2 is a sectional view taken on line a-a' in FIG. 1.

As shown in FIG. 1, a semiconductor device 100 has gate electrodes 112 (word lines), a first wire 130, second wires 142, and MIM capacitors 150. The gate electrodes 112 are formed over a semiconductor substrate 102. The second wires 142 are formed so as to be perpendicular to the gate electrodes 112. The MIM capacitors 150 are formed at positions overlapping with regions where the second wires 142 are formed. The first wire 130 is formed in parallel with the gate electrodes 112 (word lines) but may be formed so as to be perpendicular to the gates (word lines). In a planar view, although FIG. 1 shows a configuration of a 1T1C type, the present embodiment is not limited to this aspect.

As shown in FIG. 2, a semiconductor device 100 has a semiconductor substrate, a transistor, and an MIM capacitor 150. An element isolation layer 104 is formed over the semiconductor substrate 102. The element isolation layer 104 separates an element region formed in the semiconductor substrate 102 from another region. In the element region, the transistor is formed over the semiconductor substrate 102. The transistor has a gate dielectric film 110, a gate electrode 112, and a diffusion layer comprising a source diffusion layer 106a and a drain diffusion layer 106b. Then a spacer 118 is formed over both the sidewalls of the gate electrode 112. Here, the source diffusion layer 106a and the drain diffusion layer 106b be either an N-type impurity diffusion layer or a P-type impurity diffusion layer. Silicide layers 108a and 108b are formed at the surfaces of the diffusion layers.

The silicide layers 108a and 108b comprise an alloy of a metal such as cobalt, nickel, or platinum and silicon. Further, as the gate electrode of the transistor, a polysilicon electrode usually used, a polysilicon electrode partially metal-silicided, or a metal gate electrode may be used. Moreover, as a method for forming a metal gate electrode, a gate first method and a gate last method are known methods and either of the methods can be adopted.

A first interlayer dielectric layer 120 covering the transistor is formed over the semiconductor substrate 102. Contacts 122a and 122b are embedded into the first interlayer dielectric layer 120. The contact 122a is coupled to the source diffusion layer 106a and the contact 122b is coupled to the drain diffusion layer 106b. As a material for the contacts 122a and 122b, a metal such as W or Al is used.

A first cap dielectric layer 124 and a second interlayer dielectric layer 126 are formed over the first interlayer dielectric layer 120. A first wire 130 is embedded into the second interlayer dielectric layer 126. The first wire 130 is a damascene wire and is coupled to the contact 122b in the lower layer. The first wire 130 comprises a barrier metal film 128a and an embedded metal layer 128b. As a material for the embedded metal layer 128b, an alloy containing an additive of W or Al in addition to Cu, an alloy containing Cu by 90 mass % or more, and a metal comprising only Cu are nominated for example. The first wire 130 has a dual-damascene structure, but is not limited to this aspect, and may have a single-damascene structure, or may be a wire not having a via. A second cap dielectric layer 132 is formed over the upper face of the first wire 130 and over the second interlayer dielectric layer 126.

Further, as shown in FIG. 2, a recess 160 is formed in the second interlayer dielectric layer 126. An MIM capacitor 150 is formed in the recess 160. The MIM capacitor 150 has a structure formed by stacking a lower electrode 152, a capacitance dielectric layer 154, and an upper electrode 156 in this sequence. In the present embodiment, the lower electrode 152 is embedded into the recess 160 and formed over the bottom and the sidewall of the recess 160. The capacitance dielectric layer 154 is formed over the lower electrode 152 in the recess 160 and extends over the second cap dielectric layer 132 outside an opening. Further, the upper electrode 156 is formed into an identical shape to the capacitance dielectric layer 154 in a planar view (here, variation in manufacturing steps is allowable). That is, the upper electrode 156 is formed over the capacitance dielectric layer 154 in the recess 160 and extends over the capacitance dielectric layer 154 outside the opening.

The MIM capacitor 150 according to the present embodiment is electrically coupled to the source diffusion layer 106a of the transistor through the contact 122a. It may be coupled further through a wire or directly to the source diffusion layer 106a. Further, as the sectional shape of the MIM capacitor 150, various shapes such as a tapered shape of reducing the diameter toward a substrate and a rectangular shape can be adopted. Further, a structure formed by embedding the whole MIM capacitor 150 into the recess 160 or a stacked structure formed by not embedding the whole MIM capacitor 150 into the recess 160 may be adopted. Here, the MIM capacitor 150 is explained in detail in a manufacturing method that will be described later and, in the present embodiment, the capacitance dielectric layer 154 is in the state of sufficiently crystallized and hence a semiconductor device having a satisfactory capacitor capacitance can be materialized.

A third interlayer dielectric layer 134, a third cap dielectric layer 136, and a fourth interlayer dielectric layer not shown in the figure are formed over the MIM capacitor 150 and over the second cap dielectric layer 132. A second wire 142 is formed in the fourth interlayer dielectric layer. The second wire 142 and the MIM capacitor 150 are coupled to each other through a via 140. A barrier metal film 138 is formed over the bottom face and the sidewall of the second wire 142. Further, the via 140 may be coupled to any region of the upper electrode 156 but, in the present embodiment, is coupled to a part of the upper electrode 156 extending outside the opening.

A manufacturing method of a semiconductor device 100 according to the present embodiment is explained hereunder. FIGS. 3A to 7 are sectional views showing the manufacturing procedure of a semiconductor device according to the present embodiment. The manufacturing method of a semiconductor device 100 according to the present embodiment (hereunder referred to as the present step occasionally) includes the following steps. Firstly, a lower electrode 152 is formed over a substrate (semiconductor substrate 102). Successively, the lower electrode 152 is primarily crystallized. Successively, a capacitance dielectric layer 154 is formed over the lower electrode 152 after subjected to the primary crystallization treatment. Successively, the capacitance dielectric layer 154 is secondarily crystallized. Successively, an upper electrode 156 is formed over the capacitance dielectric layer 154. Detailed descriptions are made hereunder.

Figure 3A:
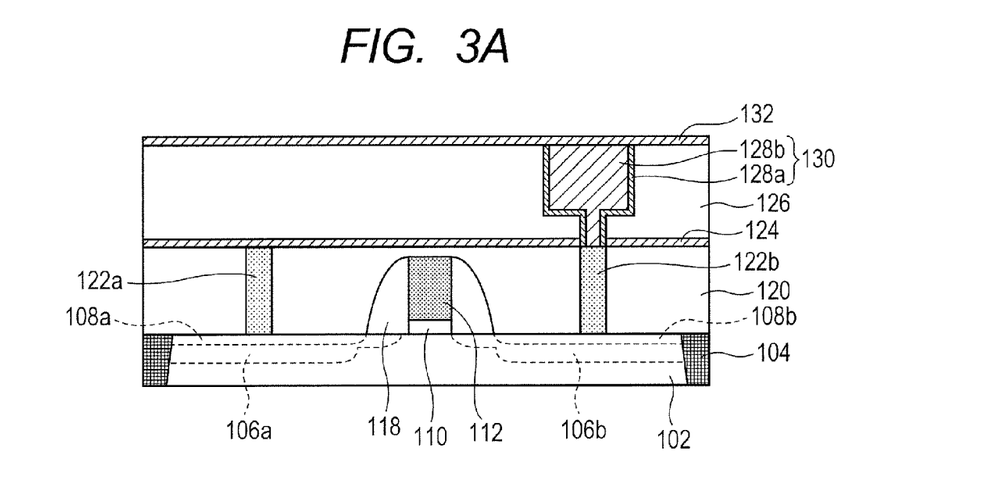
FIGS. 3A and 3B are sectional views showing the manufacturing procedure of a semiconductor device according to the present embodiment.

Firstly, as shown in FIG. 3A, an element isolation layer 104 and a transistor formed over an element region isolated from another region by the element isolation layer 104 are formed over a semiconductor substrate 102 by an ordinarily used method. In the present embodiment, as the semiconductor substrate 102, a wafer-shaped silicon substrate is used for example. Silicide layers 108a and 108b are formed by siliciding the surface of a diffusion layer (a source diffusion layer 106a and a drain diffusion layer 106b) of the transistor. A gate dielectric film 110 and contacts 122a and 122b coupled to the diffusion layer of the transistor are formed over them. In the present embodiment, an ordinarily used manufacturing method of a semiconductor device may be used until the step of forming the contacts 122a and 122b. For example, although it is not shown in the figure, the contacts 122a and 122b are formed by: depositing a first interlayer dielectric layer 120 after a transistor is formed; successively forming an opening to act as a cell contact by a photolithography method; successively embedding a contact material by a CVD (Chemical Vapor Deposition) method; and removing a redundant contact material by a CMP (Chemical Mechanical Polishing) method. Further successively, a first cap dielectric layer 124 and a second interlayer dielectric layer 126 are deposited and flattened by a CMP method.

Successively, a via hole and a wiring groove are formed in the first cap dielectric layer 124 and the second interlayer dielectric layer 126 and a barrier metal film 128a and a wiring material (an embedded metal layer 128b) are embedded into the via hole and the wiring groove. Successively, a first wire 130 is formed by removing redundant metal by CMP. Successively, a second cap dielectric layer 132 is formed over the first wire 130 and the second interlayer dielectric layer 126.

Figure 3B:
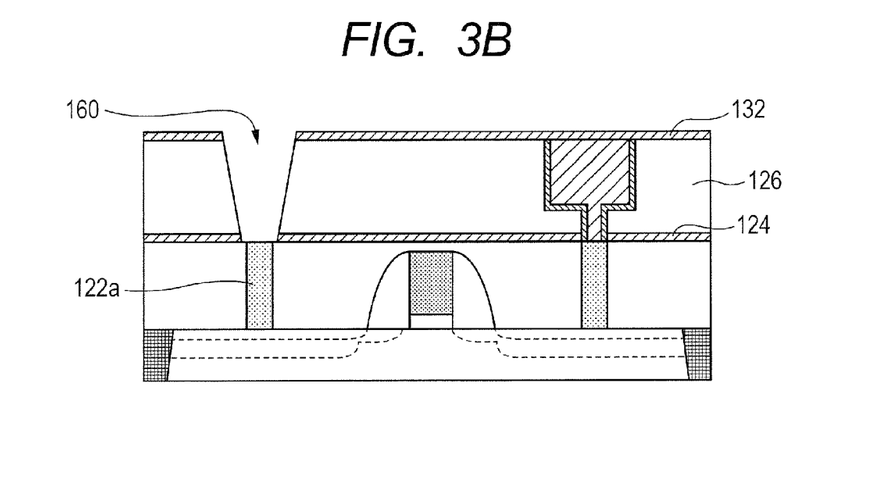

Successively, as shown in FIG. 3B, a recess 160 is formed by selectively removing the second interlayer dielectric layer 126 and the second cap dielectric layer 132. A photolithography method and an etching method can be used for example.

In the present step, the aspect ratio (it means the ratio of an opening depth to a maximum opening width) of the recess 160 is not particularly limited but the lower limit thereof is preferably 3 or more and yet preferably 5 or more for example. Meanwhile, the upper limit thereof is not particularly limited but is preferably 10 or less. Since a capacitance dielectric layer 154 according to the present embodiment is sufficiently crystallized, it is possible to materialize electrical thinning in an MIM capacitor 150 of such a high aspect ratio.

Figure 4A:
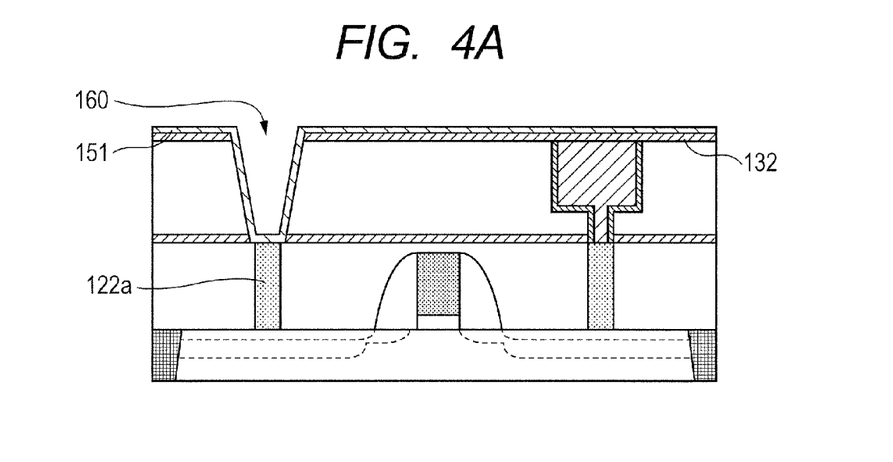
FIGS. 4A and 4B are sectional views showing the manufacturing procedure of a semiconductor device according to the present embodiment.

Successively, as shown in FIG. 4A, a lower electrode layer 151 is deposited at least in the recess 160. In the present embodiment, the lower electrode layer 151 is deposited also over the upper face of the second cap dielectric layer 132 as well as in the recess 160. As a material for the lower electrode layer 151, a material containing at least one kind selected from the group consisting of TiN, Ti, W, WN, Pt, Ir, and Ru is nominated for example. Further, the thickness of the lower electrode layer 151 is not particularly limited but can be 3 to 20 nm for example. Furthermore, the lower electrode layer 151 is formed by any one of a PVD (Physical Vapor Deposition) method, a CVD method, and an ALD method. In the present embodiment here, TiN is used for the lower electrode layer 151.

Successively, the lower electrode layer 151 is primarily crystallized. In the primary crystallization treatment, the lower electrode layer 151 is annealed in the atmosphere where $N_2$ is in the state of plasma for example. By so doing, it is possible to bring a nitrogen radical into contact with the lower electrode layer 151. An annealing temperature is not particularly limited but is preferably 340° C. to 400° C. for example.

In the present embodiment, a series of steps of forming the lower electrode layer 151 and applying primary crystallization treatment may be carried out with a remote plasma ALD apparatus for example. For example, the step of forming the lower electrode layer 151 and the step of applying primary crystallization treatment may be repeated alternately. By so doing, it is possible to equally nitride the surface layer parts of the lower electrode layer 151 over the bottom face and the sidewall of the recess 160. In other words, it comes to be possible to configure the surface layer part of the lower electrode layer 151 in a region touching a capacitance dielectric layer 154, which will be described later, with polycrystalline metal nitride.

Figure 4B:
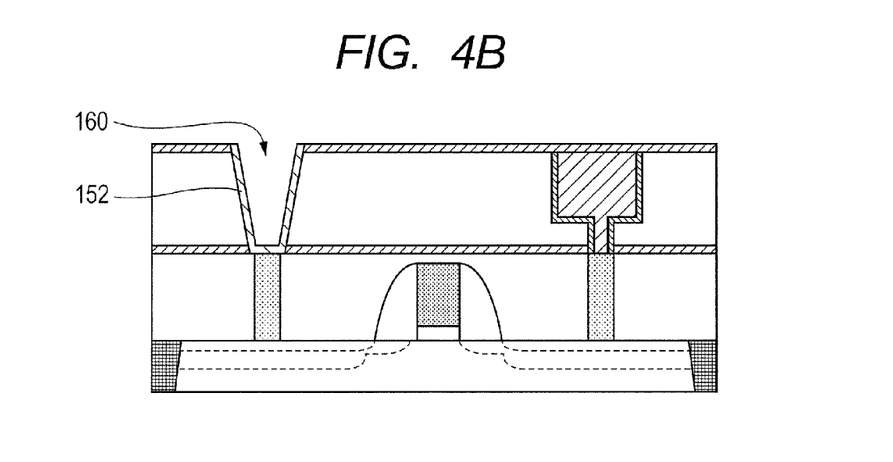

Successively, as shown in FIG. 4B, a lower electrode 152 is formed by patterning the lower electrode layer 151 into a desired shape. For example, it is possible to etch-back the lower electrode layer 151 over the second cap dielectric layer 132 by dry etching after a resist film that is not shown in the figure is embedded into the recess 160. Then the embedded resist film not shown in the figure is removed by exfoliation treatment. By so doing, the lower electrode 152 is formed selectively only over the bottom and the sidewall of the recess 160. In other words, the lower electrode 152 is embedded only in the recess 160. Here, although explanations have been made on the basis of the sequence of forming the lower electrode layer, applying primary crystallization treatment, and then processing in the present step, the present invention is not limited to this aspect and it is also possible to apply primary crystallization treatment after forming the lower electrode layer and processing for example.

In the present embodiment, it is possible to make the capacitance dielectric layer 154 formed over the lower electrode 152 succeed to the crystalline characteristic of the lower electrode 152. Further, by increasing the nitrogen concentration over the surface of the lower electrode 152 by the primary crystallization treatment, an oxidization layer (TiOx when TiN is used as the lower electrode 152) is inhibited from forming over the surface. Consequently, the capacitance dielectric layer 154 formed in an upper layer is inhibited from being amorphous. As a result, the capacitance dielectric layer 154 according to the present embodiment is crystallized sufficiently in comparison with the case where the lower electrode in a lower layer is not crystallized.

Figure 5A:
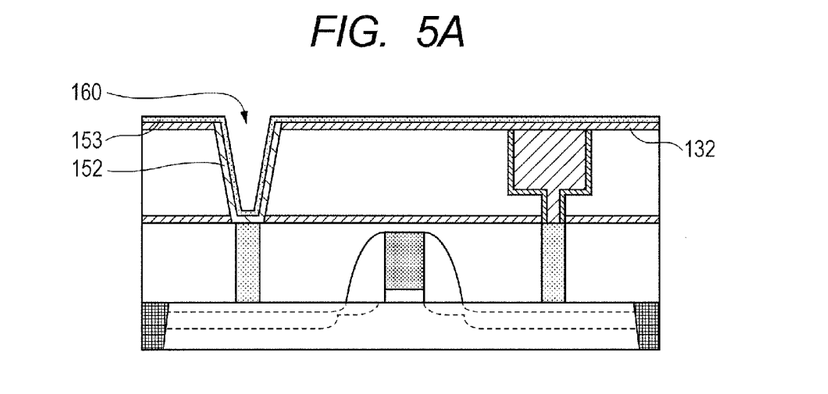
FIGS. 5A and 5B are sectional views showing the manufacturing procedure of a semiconductor device according to the present embodiment.

Successively, as shown in FIG. 5A, a capacitance dielectric layer 153 is formed at least over the lower electrode 152 in the recess 160. In the present embodiment, the capacitance dielectric layer 153 is formed over the second cap dielectric layer 132 outside the opening in addition to over the lower electrode 152. A material for the capacitance dielectric layer 153 is not particularly limited but a material containing at least one kind selected from the group consisting of $ZrO_2$, $HfO_2$, $Ta_2O_3$, and a substance produced by adding Ti, Al, Y, or lanthanoid to any one of them is nominated for example. Further, the capacitance dielectric layer 153 is formed by an ALD method for example. In the present embodiment here, $ZrO_2$ is used as the capacitance dielectric layer 153.

Successively, the capacitance dielectric layer 153 is secondarily crystallized. The secondary crystallization treatment includes a step of heating the capacitance dielectric layer 153 under the temperature condition of preferably 340° C. to 440° C. and yet preferably 380° C. to 400° C. in a non-oxidizing atmosphere for example. The non-oxidizing atmosphere means an atmosphere of a rare gas such as Ar or He, or an inert gas such as $N_2$ or a forming gas (mix gas of $H_2$ and $N_2$). Then, heating time is not particularly limited but can be preferably 1 to 60 min. and yet preferably 10 to 30 min. for example.

In the present step, by setting the temperature condition of the secondary crystallization treatment at 380° C. or higher, it is possible to inhibit the film forming time from delaying and enhance productivity. Meanwhile, by setting the temperature condition of the secondary crystallization treatment at 400° C. or lower, it is possible to inhibit a leak current from increasing and a capacitor capacitance from lowering (inhibit a capacitor characteristic from deteriorating). In this way, in the present embodiment, the balance between the improvement of productivity and the inhibition of deterioration in the capacitor characteristic can be materialized. Moreover, in the present step, it is possible to: increase the capacitor capacitance by setting heating time in the secondary crystallization treatment at 10 min. or more; and enhance productivity by setting the heating time at 30 min. or less.

Figure 5B:
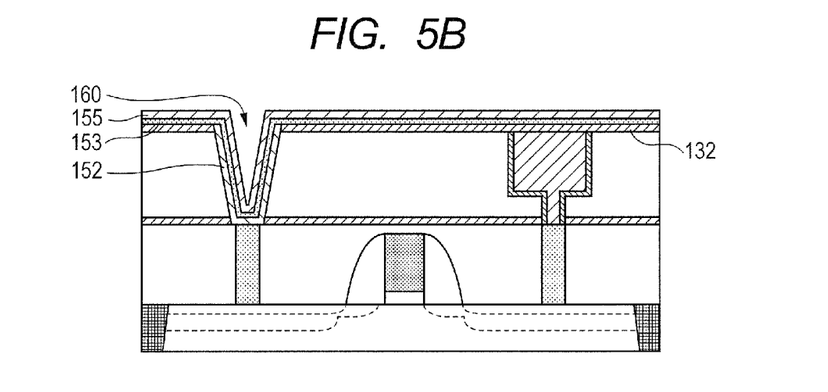

Successively, as shown in FIG. 5B, an upper electrode layer 155 is formed over the capacitance dielectric layer 153. As a material for the upper electrode layer 155, a material containing at least one kind selected from the group consisting of TiN, Ti, W, WN, Pt, Ir, and Ru is nominated for example. Further, the thickness of the upper electrode layer 155 is not particularly limited but can be 10 to 50 nm for example. Then the upper electrode layer 155 is formed by any one of a PVD method, a CVD method, and an ALD method. In the present embodiment here, TiN is used as the upper electrode layer 155.

Figure 6A:
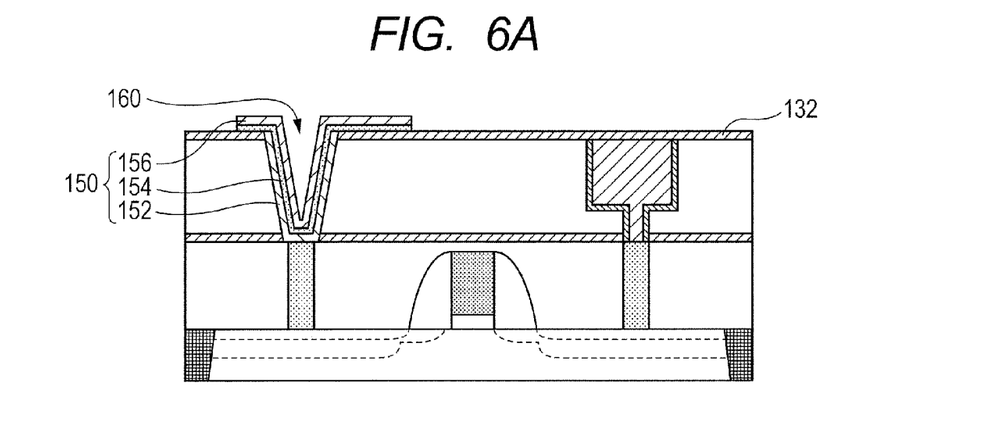
FIGS. 6A and 6B are sectional views showing the manufacturing procedure of a semiconductor device according to the present embodiment.

Successively, as shown in FIG. 6A, a capacitance dielectric layer 154 and an upper electrode 156 are formed by patterning the capacitance dielectric layer 153 and the upper electrode layer 155 into a desired shape. The method for patterning is similar to the patterning of the lower electrode layer 151. The capacitance dielectric layer 154 and the upper electrode 156 remain over the second cap dielectric layer 132 outside the opening as well as in the recess 160. Further, the capacitance dielectric layer 154 and the upper electrode 156 are formed in the manner of being remote from each other between adjacently formed element forming regions. By so doing, an MIM capacitor 150 shown in FIG. 6A is formed in the recess 160. Although the MIM capacitor 150 has a three-dimensional MIM capacitance structure shown in FIG. 6A in the present embodiment, the present invention is not limited to this aspect and may have a stack structure formed by simply stacking layers for example.

The thickness (physical thickness) of the capacitance dielectric layer 154 is not particularly limited but, for example, the upper limit is preferably 10 nm or less, yet preferably 7 nm or less, and still yet preferably 6 nm or less and the lower limit is preferably 4 nm or more. Even when the thickness of the capacitance dielectric layer 154 is set at 6 nm or less in particular, in the present embodiment, it is possible to inhibit the deterioration of a capacitor capacitance caused when the thickness is reduced as it will be described later.

Further, the relative permittivity of the capacitance dielectric layer 154 is not particularly limited but can be 20 to 50 for example. Even in the case where the thickness of the capacitance dielectric layer 154 is 7 nm or less for example, since the capacitance dielectric layer 154 is crystallized sufficiently, it is possible to control the relative permittivity of the capacitance dielectric layer 154 in the above range. By physically thinning a layer and enhancing a relative permittivity simultaneously in this way, the electrical thinning of the capacitance dielectric layer 154 can be materialized in an MIM capacitor 150 of a high aspect ratio.

Figure 6B:
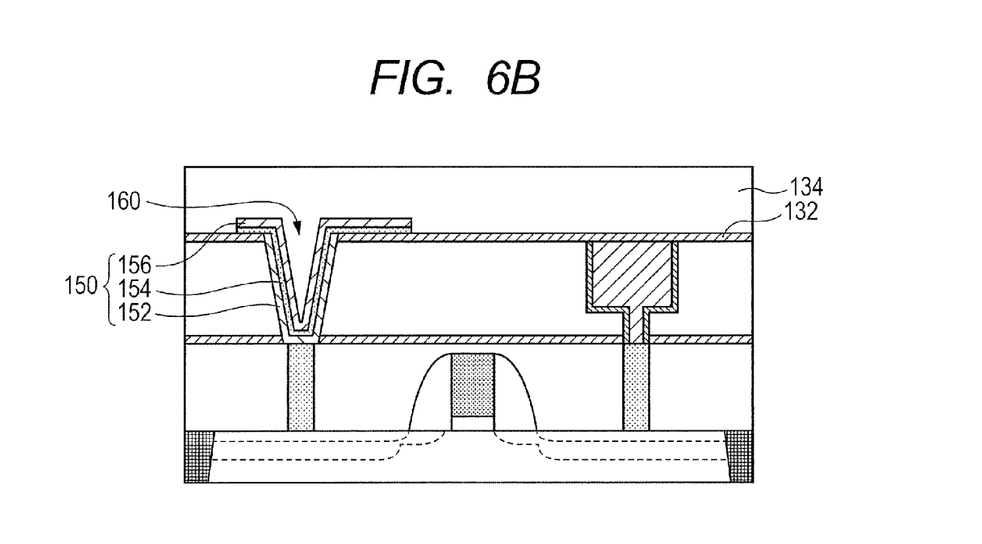
Figure 7:
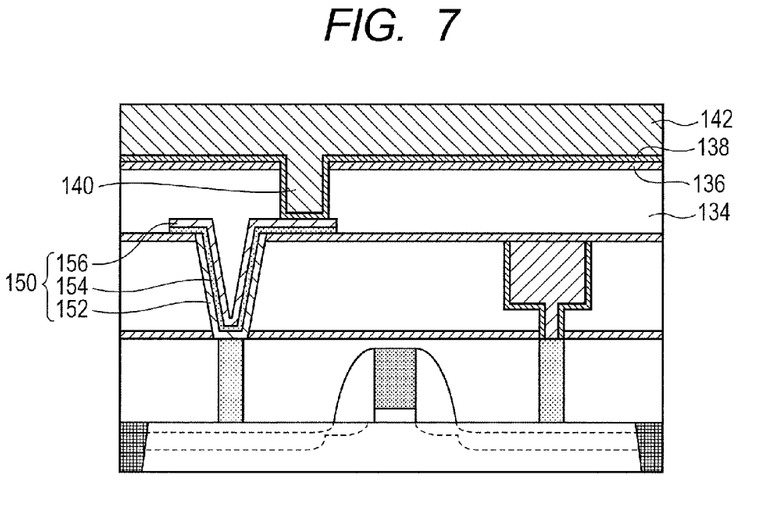
FIG. 7 is a sectional view showing the manufacturing procedure of a semiconductor device according to the present embodiment.

Successively, as shown in FIG. 6B, a third interlayer dielectric layer 134 is formed over the MIM capacitor 150 and over the second cap dielectric layer 132. Successively, as shown in FIG. 7, a third cap dielectric layer 136 and a fourth interlayer dielectric layer not shown in the figure are formed over the third interlayer dielectric layer 134. Successively, a via hole penetrating the fourth interlayer dielectric layer and the third interlayer dielectric layer 134 and reaching the upper face of the upper electrode 156 is formed. Then, a wiring groove continuing to the via hole is formed in the fourth interlayer dielectric layer. Successively, the third cap dielectric layer 136 and a metal film are embedded into the via hole and the wiring groove. A via 140 and a second wire 142 are formed by removing a redundant metal film by CMP. Successively, ordinary manufacturing steps of a semiconductor device be carried out. In this way, it is possible to form a semiconductor device 100 according to the present embodiment.

Functions and effects of the manufacturing method of a semiconductor device 100 according to the present embodiment are explained hereunder. In the present embodiment, a capacitance dielectric layer is formed over a lower electrode after the lower electrode is primarily crystallized and then the capacitance dielectric layer is secondarily crystallized. Consequently, the effect of the secondary crystallization treatment is accelerated by the pretreatment of forming a film over a base after the base is primarily crystallized. As a result, it comes to be possible to sufficiently crystallize the capacitance dielectric layer in comparison with the case of applying either primary crystallization treatment or secondary crystallization treatment. By so doing, it is possible to increase the relative permittivity of the capacitance dielectric layer and materialize a capacitor of a large capacitance.

Combined use of primary crystallization treatment and secondary crystallization treatment exhibits a particularly effective effect when an MIM capacitor has a three-dimensional structure of a high aspect ratio. That is even in the case where a higher aspect ratio advances and the thickness reduction of a capacitance dielectric layer is demanding, the crystallizability is secured sufficiently and hence a capacitor of a large capacitance can be materialized. Further, the base of the sidewall part in the three-dimensional structure (lower electrode) can be crystallized by the primary crystallization treatment and hence the capacitance dielectric layer at the sidewall part can be crystallized excellently. Furthermore, the capacitance dielectric layer at the sidewall part can be crystallized by the secondary crystallization treatment. In this way, it is possible to: sufficiently accelerate the crystallization not only at the bottom part but also at the sidewall part; and hence materialize a capacitor of a large capacitance.

Meanwhile, a semiconductor device 100 according to the present embodiment is very effective for a highly miniaturized DRAM (Dynamic Random Access Memory) or a DRAM-consolidated device.

Further, the effects of a particularly preferred aspect in the manufacturing method of a semiconductor device 100 according to the present embodiment are explained in comparison with reference examples.

Figure 8:
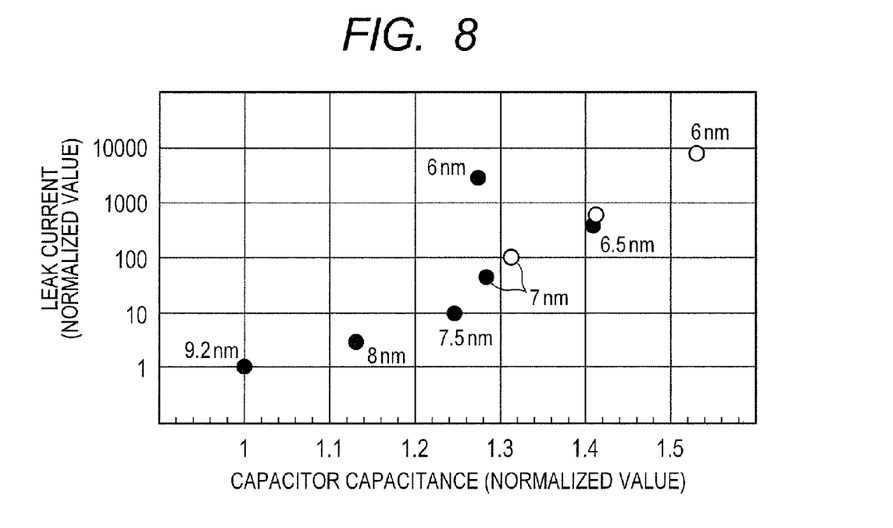
FIG. 8 is a graph showing the relationship between a leak current and a capacitor capacitance.

FIG. 8 is a graph showing the relationship between a leak current and a capacitor capacitance. In the figure, the white circles represent particularly preferred aspects (hereunder referred to as present preferred embodiments) of the present embodiment and the black circles represent reference examples. The present preferred embodiments and the reference examples are explained on the basis of the structure of the MIM capacitor shown in FIG. 2. In the present preferred embodiments, primary crystallization treatment and secondary crystallization treatment are combinedly used. In the reference examples in contrast, although primary crystallization treatment is applied, the secondary crystallization treatment is not applied. The numerals in the figure represent the thicknesses of the capacitance dielectric layers.

Further, FIG. 8 shows the result obtained by plotting the results of measuring the leak currents flowing in the capacitance dielectric layers at 0.6 V along the vertical axis and the capacitor capacitance values along the horizontal axis. Each measured value is a value standardized by regarding the value in the case of the capacitance dielectric film having a thickness of 9.2 nm in the figure as 1.

In the reference examples shown in the figure, when the capacitance dielectric layers are in the thickness range of 9.2 to 7.5 nm, the leak currents and the capacitor capacitances show a nearly proportional relationship. In other words, it is obvious that the plots are nearly on an identical line in the reference examples having the capacitance dielectric layers of 7.5 nm or more.

In the reference examples of the capacitance dielectric layers 7 nm or less in thickness however, the capacitor capacitances reduce more than those of the present preferred embodiments. Moreover, it is obvious that the capacitor capacitance reduces by about 10% in the reference example of the capacitance dielectric layer 6 nm in thickness in comparison with the case of 6.5 nm. In this way, in the reference examples, it sometimes happens that a capacitor capacitance does not increase but lowers in accordance with the thinning of a capacitance dielectric layer.

In the present preferred embodiments shown in the figure in contrast, it is obvious that the leak currents and the capacitor capacitances show nearly proportional relationship in accordance with the thinning of capacitance dielectric layers in the thickness range of 7 nm or less. Moreover, in the present preferred embodiment of the capacitance dielectric layer 6 nm or less in thickness, unlike the reference examples, the capacitor capacitance does not reduce in comparison with the case of 6.5 nm. That is, in the present preferred embodiments, the capacitor capacitances are inhibited from not increasing but reducing in accordance with the thinning of capacitance dielectric layers. As a result, it is obvious that the present preferred embodiments are particularly effective when an MIM capacitor has a three-dimensional structure of a high aspect ratio.

Figure 9:
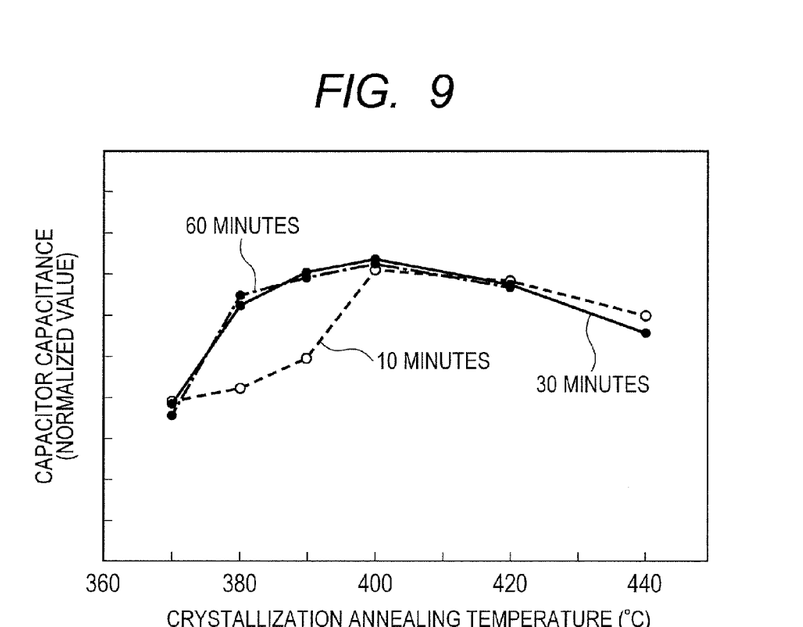
FIG. 9 is a graph showing the relationship between a capacitor capacitance and a crystallization annealing temperature.
Figure 10:
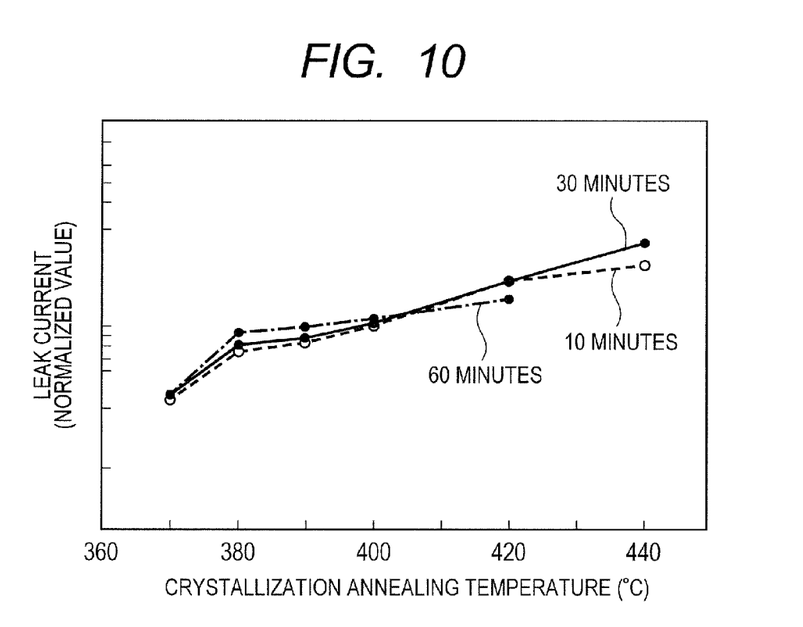
FIG. 10 is a graph showing the relationship between a leak current and a crystallization annealing temperature.

The case where the conditions of heating time and annealing temperature at secondary crystallization treatment are changed in the present embodiment is explained hereunder. FIG. 9 is a graph showing the relationship between a capacitor capacitance and a crystallization annealing temperature. That is, FIG. 9 shows the influence of a crystallization annealing temperature and a crystallization annealing time on a capacitor capacitance. Further, FIG. 10 is a graph showing the relationship between a leak current and a crystallization annealing temperature. That is, FIG. 10 shows the influence of a crystallization annealing temperature and a crystallization annealing time on a leak current (applied voltage is 0.6 V) flowing in a capacitance film. The crystallization annealing temperatures in FIGS. 9 and 10 represent annealing temperatures in secondary crystallization treatment.

As shown in FIG. 9, it is obvious that, when an annealing temperature is low, 400° C. or lower for example, it is possible to increase a capacitor capacitance by prolonging a heating time to 30 and 60 min. rather than 10 min. Meanwhile, as shown in FIG. 10, a leak current scarcely increases even when a heating time is changed. Consequently, from the viewpoint of compatibility of a large capacitor capacitance and a high productivity, it is particularly preferable that an annealing temperature is 380° C. to 400° C. and a heating time is 10 to 30 min.

Here, it is a matter of course that the embodiments and plural modified examples stated above can be combined within the range of not making the contents incompatible. Further, although the structure of each part and the like are concretely explained in the embodiments and plural modified examples stated above, the structure and the like can be changed variously within the range of satisfying the presently applied invention.

What is claimed is:

1. A manufacturing method of a semiconductor device comprising:

forming a lower electrode over a substrate by repeatedly alternating deposition of one of a plurality of layers constituting the lower electrode with application of a primary crystallization treatment to the deposited layer;

forming a capacitance dielectric layer over said lower electrode;

secondarily crystallizing said capacitance dielectric layer;

forming an upper electrode over said capacitance dielectric layer;

forming an interlayer dielectric layer over said substrate; and forming a recess in said interlayer dielectric layer, wherein said forming said lower electrode includes at least forming said lower electrode over the bottom and the sidewall of said recess, and the aspect ratio of said recess is 3 or more.

2. The manufacturing method according to claim 1, wherein said secondarily crystallizing includes heating said capacitance dielectric layer under a temperature condition of 380° C. to 400° C. in a non-oxidizing atmosphere.

3. The manufacturing method according to claim 1, wherein said primary crystallization treatment includes bringing a nitrogen radical into contact with the deposited layer of said lower electrode.

4. The manufacturing method according to claim 1, wherein the thickness of said capacitance dielectric layer is 7 nm or less.

5. The manufacturing method according to claim 1, wherein the relative permittivity of said capacitance dielectric layer is 20 to 50.

6. The manufacturing method according to claim 1, wherein said capacitance dielectric layer includes at least one kind selected from the group consisting of $ZrO_2$, $HfO_2$, $Ta_2O_3$, and a substance produced by adding Ti, Al, Y, or lanthanoid to one of those.

7. The manufacturing method according to claim 1, wherein said forming the lower electrode is performed using a remote plasma atomic layer deposition (ALD) apparatus.

* * * * *